United States Patent [19]
Cullen et al.

[11] Patent Number: 5,332,653
[45] Date of Patent: Jul. 26, 1994

[54] PROCESS FOR FORMING A CONDUCTIVE REGION WITHOUT PHOTORESIST-RELATED REFLECTIVE NOTCHING DAMAGE

[75] Inventors: Mark J. Cullen, Sunnyvale, Calif.; Sean Hunkler, Austin, Tex.

[73] Assignee: Motorola, Inc., Schaumburg, Ill.

[21] Appl. No.: 907,076

[22] Filed: Jul. 1, 1992

[51] Int. Cl.$^5$ .................................................. G03C 5/00
[52] U.S. Cl. ................................. 430/323; 430/325; 430/326; 430/261; 430/272; 430/314; 430/318; 430/319; 430/395
[58] Field of Search ............... 430/323, 325, 326, 261, 430/272, 314, 318, 319, 395

[56] References Cited

U.S. PATENT DOCUMENTS

| | | | |
|---|---|---|---|
| 4,207,105 | 6/1980 | Sato | 430/432 |
| 4,333,793 | 6/1982 | Lifshitz et al. | 156/643 |
| 4,624,749 | 11/1986 | Black et al. | 204/15 |
| 4,778,563 | 10/1988 | Stone | 156/643 |
| 4,871,630 | 10/1989 | Giammarco et al. | 430/325 |

Primary Examiner—John Kight, III
Assistant Examiner—Duc Truong
Attorney, Agent, or Firm—Keith E. Witek

[57] ABSTRACT

A process for forming a conductive region without photoresist-related reflective notching damage has a starting step (23) wherein a photoresist layer is formed over a conductive layer (34). The photoresist layer is used to mask the conductive layer. The photoresist layer is lithographically processed and chemically developed to form a masking photoresist region (38) overlying the conductive layer (34). The masking photoresist region has a sidewall and has a reflective notch which results from the lithographic processing. A hardening step, performed in-situ with a plurality of conductive layer etch steps, is used to form an etch-resistant polymer layer (40) on the photoresist sidewalls and on the reflective notch. The conductive layer (34) is etched after the formation of the polymer layer (40) to form a conductive region. The polymer layer (40) reduces an etch rate of the reflective notch and the photoresist sidewall so that the conductive region is formed having no reflective notching etch damage.

22 Claims, 2 Drawing Sheets

PROCESS FOR FORMING A CONDUCTIVE REGION WITHOUT PHOTORESIST-RELATED REFLECTIVE NOTCHING DAMAGE

FIELD OF THE INVENTION

The present invention relates generally to semiconductor technology, and more particularly, to conductive layer and photoresist processing.

BACKGROUND OF THE INVENTION

In order to fabricate devices on an integrated circuit, several photoresist masking steps and lithography exposure steps must be performed. To form a patterned layer of material, a layer of material is formed on the integrated circuit. A photoresist material is spun and baked onto a surface of the layer of material. The photoresist is then exposed to light using a mask to protect or expose predetermined areas of the photoresist. The light alters the chemical and/or mechanical properties of the exposed photoresist to create removable photoresist portions and non-removable photoresist portions. A developer chemical is used to subsequently remove the removable photoresist portions and leave the non-removable portions overlying the layer of material to mask portions of the layer of material. The layer of material is then etched to form the patterned layer of material by using the non-removable photoresist portions as a mask.

In many cases, the patterned layer of material is formed over topographical surfaces which have large variations in vertical height and many sloped surfaces. The sloped surfaces and changes in topography can reflect the light that is used to expose portions of the photoresist. This reflection can damage or inadvertently result in the removal of portions of the photoresist that were not meant to be removed. This phenomenon, known as reflective notching, will in many cases result in patterned layers of material that are incorrectly dimensioned or incorrectly electrically open circuited. The incorrect dimensions and electrical disconnections can render an integrated circuit useless.

When the light, having an initial frequency, is reflected, the resulting reflected light usually has a frequency which is phase shifted from the original frequency. Because of the frequency phase shift, a commercially available dye can be applied to an integrated circuit to absorb the reflected light while not absorbing the non-reflected light. If all of the reflected light is absorbed, no reflective notching of photoresist will occur. The frequency phase shift of the reflected light is small and is usually equipment, frequency, and integrated circuit material dependent. In addition, the dye used to absorb reflected light is very expensive. Therefore, the use of a dye to avoid reflective notching has not been used for large scale manufacturing and has not been widely accepted.

Reflective notching has also been avoided through the use of an anti-reflective coating (ARC). The ARC layer is a thin sacrificial layer formed under photoresist to absorb most of the incoming light. Most ARC materials have a small process window and have etch rates which are too low for production applications. In addition, the selectivity of many ARC materials to conductive layers is very low. Therefore, polysilicon or metal lines which underlie an ARC coating may be damaged when the ARC coating is removed.

The use of thin photoresist layers has been proposed to reduce the occurrence of reflective notching. A thin resist layer requires shorter light exposure time and therefore results in less reflected light. The use of thin photoresist layers has resulted in inconsistent results and performance. In addition, thin photoresist layers reduce the amount of time that can be spent etching layers when using the thin photoresist as a mask. The selectivity of photoresist to, for example, oxide and polysilicon during etching of oxide or polysilicon is poor (on the order of 1:2).

Another method which is used to reduce the effects of reflective notching is to use oxygenated etch chemistries to improve etch selectivities to photoresist. The oxygenated chemistries form $SiO_2$ which deposits onto photoresist sidewalls to reduce the erosion of reflected notched portions of photoresist. This prevention of erosion prevents photoresist reflective notching damage from being transferred to underlying layers. Unfortunately, the $SiO_2$ sidewall deposition increases the width of critical dimensions (CDs). For example, a line that was intended to be a one micron wide line may become a one and a quarter micron wide line due to sidewall $SiO_2$ deposition.

Therefore, known methods to reduce the damaging effects of reflective notching are typically expensive, difficult to manufacture, unreliable, and/or not always process compatible.

SUMMARY OF THE INVENTION

The previously mentioned disadvantages are overcome and other advantages achieved with the present invention. In one form, the present invention comprises forming a region of conductive material overlying a substrate. A conductive layer is formed overlying the substrate, and a masking material is formed overlying the conductive layer. Openings are formed in the masking material which expose portions of the conductive layer. A pre-conditioning etch is performed on the conductive layer, and a hardening step of the masking material is performed. The portions of the conductive layer which are exposed by the openings in the mask material are removed to form the conductive region.

The present invention will be more clearly understood from the detailed description below in conjunction with the accompanying drawings.

DESCRIPTION OF THE PREFERRED EMBODIMENT

Figure 1:
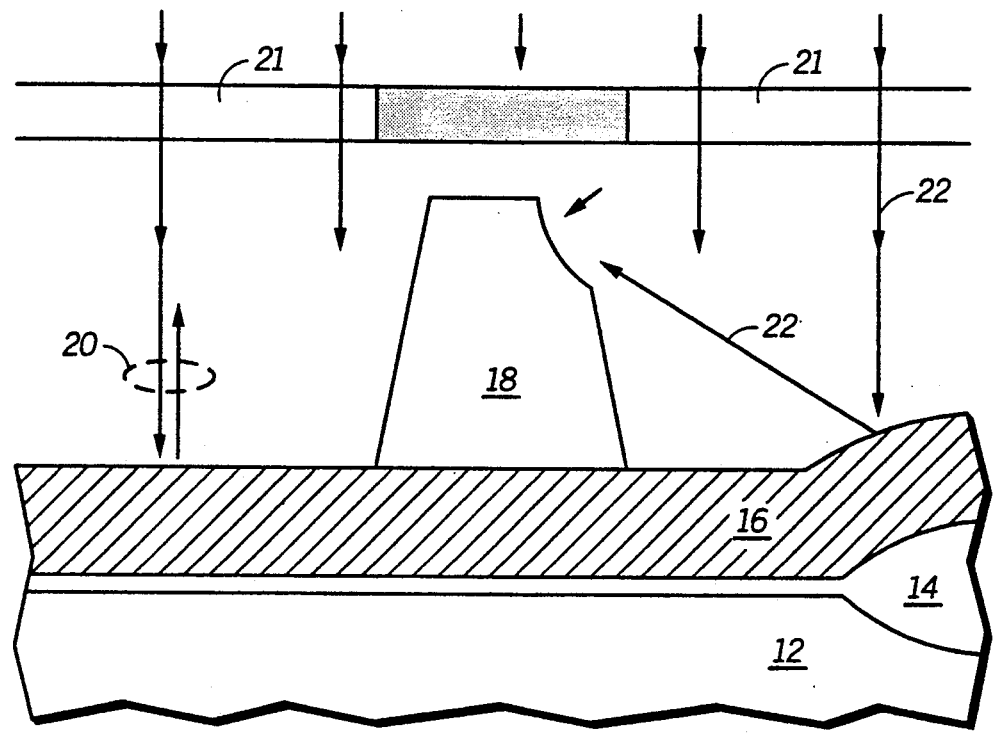
FIG. 1 illustrates, in cross-sectional form, a known reflective notched photoresist region resulting from light reflecting off of topographical features.

Illustrated in FIG. 1 is a known phenomenon referred to as reflective notching on an integrated circuit. In FIG. 1, a substrate 12 is provided. An oxide layer 14 is formed which has a thick field oxide portion and a thin gate oxide portion. A polysilicon layer 16 is illustrated as overlying the oxide layer 14. The oxide layer 14 and polysilicon layer 16 are illustrated by way of example.

The example is directed specifically at a conventional metal oxide semiconductor (MOS) transistor reflective notching problem. It should be noted that reflective notching may occur in any application where light is used to define a mask material. Therefore, the remarks made herein may also apply for gallium arsenide and germanium based devices.

A photoresist layer 18 is formed overlying the polysilicon layer 16. Photoresist is usually formed by a spin-on and bake procedure. The photoresist layer is then exposed to light in a commercially available, photolithographic system. In many cases the light will expose the resist and reflect vertically upward as in the case of a light path 20. The light source may also reflect off of topographical surfaces such as sloped portions of layers 14 and 16 or any other sloped surfaces that exist on the integrated circuit as illustrated by a light path 22. The reflected light will in some cases be directed towards a photoresist region that was intended to be protected by a mask 21, as in the case of light path 22.

The light alters chemical and/or mechanical properties of the photoresist and allows portions of the photoresist to be developed and therefore removed from the integrated circuit as illustrated. The removal removes portions of the photoresist that were intended for removal via mask 21 but also removes photoresist portions which are not intended for removal. A region of photoresist layer 18, which was not intended for removal, is affected by reflected light via light path 22. Therefore, the resulting photoresist layer 18 has a reflective notch which is due to the reflected light that traveled along light path 22.

The reflective notch is etched during etch processing due to the fact that the reflective notch does not have a vertical or substantially vertical surface. Conventional etch chemistry is such that vertical surfaces can be protected by sidewall polymer deposition but reflective notches are not protected. Therefore, the thinner reflected notch portion etches down to the polysilicon layer 16 during polysilicon etch processing and results in damage or unwanted removal of portions of polysilicon layer 16.

Figure 2:
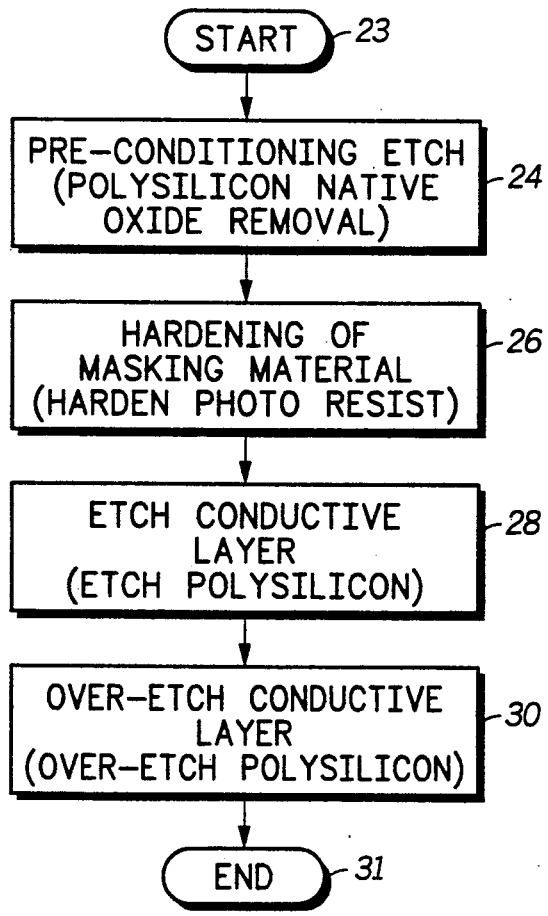
FIG. 2 illustrates in a flowchart a method for reducing various damaging effects of reflective notching in photoresist in accordance with the present invention.

In FIG. 2, a flowchart illustrates a process that is used to avoid the effects of reflective notching in conductive layers in accordance with the present invention. A starting step 23 is illustrated in FIG. 2. The starting step 23 is used to prepare an integrated circuit for processing.

In step 23, a semiconductor substrate (not illustrated in FIG. 2) is provided. The substrate may be made of silicon, gallium arsenide, silicon on sapphire (SOS), epitaxial formations, germanium, germanium silicon, polysilicon, and/or like substrate or conductive materials. Preferably, the substrate 12 is made of silicon. A conductive layer (not illustrated in FIG. 2) is formed overlying the substrate. The conductive layer may be polysilicon, silicon, amorphous silicon, germanium silicon, epitaxial formations, doped silicon, tungsten, titanium, a salicided material, a silicided material, copper, gold, aluminum, any metal, any silicon-based material, or metal alloys. In many cases, the conductive layer will have a surface that forms a native oxide layer (not illustrated in FIG. 2). This native oxide layer usually results from exposure to ambient air that contains oxygen or moisture.

A mask material (not illustrated in FIG. 2), which is preferably either positive or negative photoresist, is formed overlying the conductive layer. The photoresist is optionally soft-baked, exposed lithographically, developed, and optionally hard-baked. One or more openings are formed in the photoresist by chemical developing. The openings may leave photoresist free-standing, form contacts or via holes in the photoresist, or form any conventional photoresist pattern. The openings expose portions of the conductive layer. The photoresist, due to the processing of the openings, contains at least one region having a reflected notch. Even if the photoresist contains no reflective notches, the process described herein may be used to further avoid lateral unwanted photoresist etching.

After the initial processing described above is complete, a step 24 of FIG. 2 is performed. In step 24, a pre-conditioning etch process is performed. The pre-conditioning etch process is primarily used to remove any native oxide that may exist on the exposed portions of the conductive layer. The pre-conditioning etch may perform other functions such as surface cleaning, surface planarization, resist etch-back, particle or contamination removal, and other conventional tasks although these tasks are not common or necessary in most cases. The chemistry used to remove native oxides will vary from material to material.

After step 24, a hardening step 26 is used to alter the surface condition of the mask material, which is preferably photoresist. The masking material is exposed to a process gas which is preferably 50%–80% by volume of chlorine ($Cl_2$) or a compound containing chlorine. The remainder of the process gas is an inert carrier gas such as nitrogen, helium, or argon. In a preferred form, the process gas is introduced into a process equipment chamber capable of temperature, pressure, and/or ambient gas control. Optimally, a flow of 30–50 standard cubic centimeters (sccm) of chlorine and 10–30 sccm of an inert gas is used to create the process gas within the process equipment chamber. In addition, the process equipment chamber may be one of either a batch processing system or a single wafer system.

The exposure of the polysilicon to a chlorine ambient forms hardened polymer sidewalls on sidewalls (not illustrated in FIG. 2) of the photoresist. The polymer sidewalls, referred to also as veils, also cover any reflective notches that may occur in the photoresist. The presence of the polymer sidewall prevents resist erosion or etching of the photoresist sidewalls and reflective notches of the photoresist. The polymer sidewall material is not formed on horizontal/flat top surfaces of the photoresist due to the high rate of ion bombardment at the horizontal/flat top surfaces during step 26. Therefore, although the sidewalls and notches will not etch and therefore will not damage underlying areas, the photoresist layer is still stripped easily after functioning as a mask layer due to the fact that some top surfaces have no hardened polymer layer. Removal of the photoresist after etching of underlying layers is performed by an ash step. Our experimentation has resulted in no observed difficulty in photoresist removal, but we have noted the complete absence of reflective notch-related damage and reflective notch-related effects to underlying layers.

It is important to note that a high operating pressure during the hardening step 26 has been discovered to improve polymer sidewall formation. In addition, a relatively low equipment power was used to reduce resist loss during the hardening step 26. Other optimizations in the above process should be apparent from conventional etch technology.

After the hardening step 26 is performed, the underlying layers which are masked by the photoresist are etched in a step 28. Step 28 uses conventional etch processing to remove portions of the underlying conductive layer which may be, for example, polysilicon, silicon, amorphous silicon, germanium silicon, epitaxial formations, doped silicon, tungsten, titanium, a salicided material, a silicided material, copper, gold, aluminum, any metal, or other silicon compounds or metal alloys. A first chemistry (process gas) is used to perform this initial etch of the conductive layer.

After the etch of step 28 is performed, an optional but important over-etch step is performed on the conductive layer in an over-etch step 30. This over-etch step usually requires changing chemistry (process gas) from the first chemistry used to etch the conductive layer in step 28 to a second chemistry. On a rare occasion, an over-etch step may not require new chemistry and the over-etch chemistry will be the same as the chemistry of step 28. The over-etch step 30 is used to remove unwanted known structures such as polysilicon stringers. In addition, the over-etch is used to ensure that all portions of the conductive layer that are not masked by photoresist are removed regardless of conductive layer thickness, integrated circuit topography, chemical and mechanical variation across an integrated circuit wafer, wafer stress, known micro-loading effects, known macro-loading effects, etch equipment inconsistencies, process gas flow variation, and other known process variations and process phenomena.

After step 30, a step 31 is performed. Step 31 is an ending step wherein the photoresist is stripped or "ashed" off of the conductive layer and the integrated circuit or integrated circuit wafer continues onto other processing steps. It is important to note that multiple layer polysilicon and multiple layer metal processes exist in the prior art. The process discussed herein, in reference to FIG. 2, may be used to define any conductive layer during any stage of integrated circuit manufacturing.

The process steps 24, 26, 28, 30 described above are, in a preferred form, performed sequentially in a single semiconductor etch system. The etch system may have one or more process chambers.

The process described above is easy to manufacture and is cost effective due to the fact that no new processing equipment is required. Due to the fact that the hardening step 26 is performed in-situ with the actual conductive layer etch, excessive processing time, variations in process control, semiconductor equipment variations, integrated circuit contamination, possibility of a misprocessing error, and other unwanted conditions are avoided. Most etch systems, especially metal etch systems, are designed for use with chlorine chemistries and are installed with proper piping, tooling, and MFCs (mass flow controllers) to use chlorine. Therefore, the process described above is low maintenance and requires virtually no system alterations or set up time. Critical dimensions (CDs) of devices are not affected by the process described above. The process described above has been experimentally proven to be repeatable and consistent. Etch selectivities, photoresist removal, and process time constraints are not largely affected by the process of FIG. 2. The inventive process is also compatible with widely accepted integrated circuit processing technology.

Figure 3:
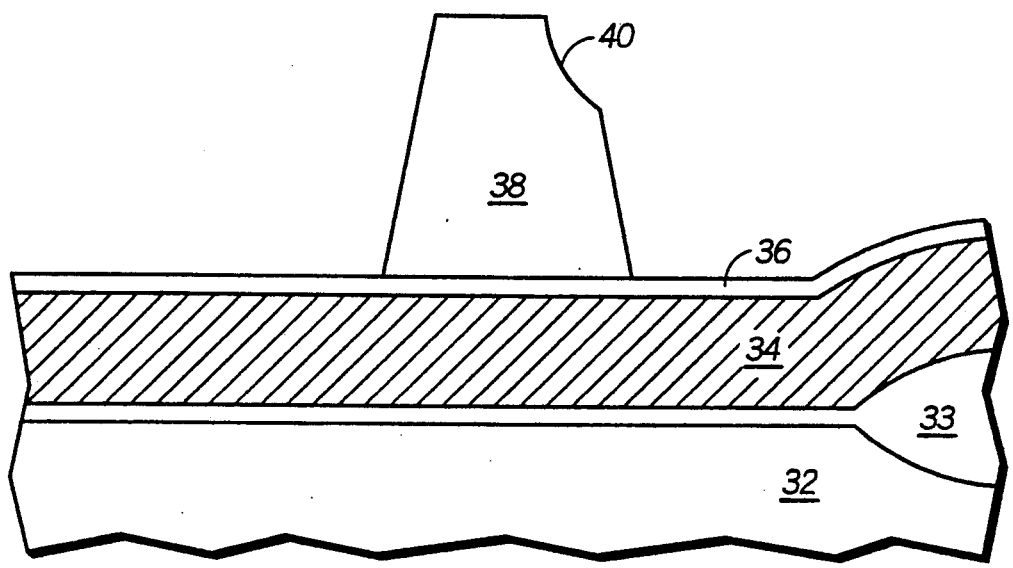
FIGS. 3-5 illustrate, in cross-sectional form, a process for forming a conductive region without photoresist-related reflective notching damage.
Figure 4:
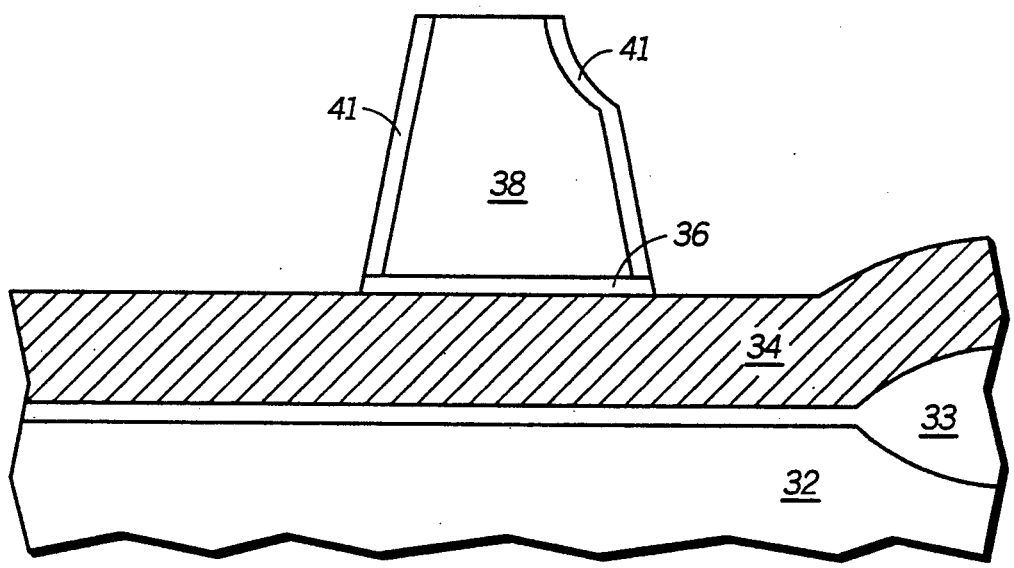
Figure 5:
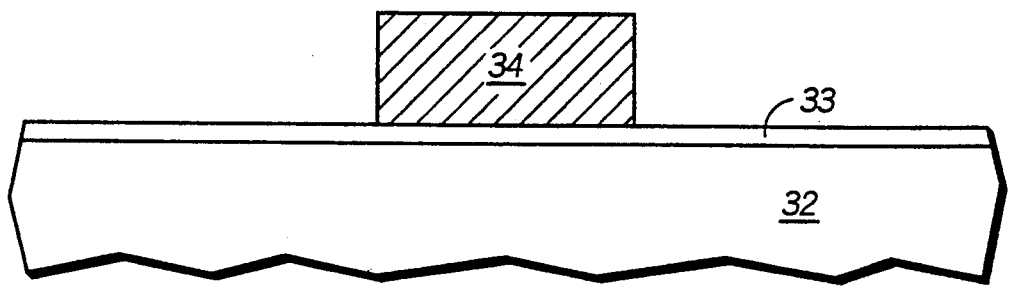

To further illustrate the inventive process of FIG. 2, cross sections of a structure are illustrated in FIGS. 3-5 wherein the cross sectioned structure of FIGS. 3-5 illustrates the process of FIG. 2.

In FIG. 3, a substrate material or substrate 32 is illustrated. The substrate 32 is similar to the substrate 12 illustrated in FIG. 1. A dielectric layer 33 is overlying the substrate 32. The dielectric layer 33 as well as other dielectric layers describe herein may be formed as wet or dry silicon dioxide ($SiO_2$), silicon nitride, tetraethylorthosilicate (TEOS) based oxides, borophosphosilicate-glass (BPSG), phospho-silicate-glass (PSG), boro-silicate-glass (BSG), oxide-nitride-oxide (ONO), plasma enhanced silicon nitride (P-$SiN_x$), a spin on glass (SOG), and/or like dielectric materials unless otherwise noted. A conductive layer 34 is overlying the dielectric layer 33. The conductive layer 34 is similar to the conductive layer discussed above in reference to FIG. 2. An optional native oxide layer 36 is illustrated as overlying the conductive layer 34. A photoresist region 38, which has sidewalls, is illustrated overlying the conductive layer 34. The photoresist region 38 has been exposed to light, developed, and has a reflective notch 40.

FIG. 4 illustrates the pre-conditioning step 24 of FIG. 2. The pre-conditioning step removes the native oxide layer 36 that is not underlying the photoresist region 38. The hardening step 26 of FIG. 2 is performed to form a veil layer, referred to as a polymer layer 41, adjacent the reflective notch 40 and the sidewalls of the photoresist region 38. No polymer layer is formed on a top planar surface of the photoresist region 38 due to the high rate of ion bombardment on the top planar surface during the hardening step 26 of FIG. 2. The polymer layer 41 will keep the sidewalls and the reflective notch 40 from etching significantly. This reduction in photoresist sidewall etching and reflective notch 40 etching will result in improved conductive formations as described herein.

In FIG. 5, the etch steps 28 and 30 of FIG. 2 are performed to remove portions of the conductive layer 34 that are not protected by the photoresist region 38. The photoresist region 38 is then removed by an ashing step. The ashing step will etch photoresist region 38 easily due to the fact that the top planar surface of the photoresist region 38 is not covered by the hardened etch-resistant polymer layer 41. The resulting conductive layer 34 in FIG. 5 has no damage or unwanted performance degradation due to the reflective notch 40.

While the present invention has been illustrated and described with reference to specific embodiments, further modifications and improvements will occur to those skilled in the art. For example, on conventional integrated circuits, multiple conductive layers and multiple conductive materials are utilized. The inventive process disclosed herein may be used to form any or all of these conductive layers. Any type of photoresist can be optimized to be hardened and polymer coated by the inventive process. Both positive and negative resist may be used. The hardening step described herein has optimal results when performed between the pre-conditioning etch step 24 of FIG. 2 and the conductive layer etch step 28 of FIG. 2. It should be apparent though that other processing sequences exist and will produce similar results. It is also known in the prior art that several etch chemistries (process gases) and various chemical flows and volumes may be used to etch the regions and layers discussed herein. It is intended in the appended claims to cover all conductive layer etch chemistries, pre-conditioned etch chemistries, and over-etch chemistries. There also may be other chemicals besides chlorine that harden and polymer coat photoresist to achieve a similar result. Therefore, it is to be understood that this invention is not limited to the particular forms illustrated and that it is intended in the appended claims to cover all modifications that do not depart from the spirit and scope of this invention.

We claim:

1. A process for forming a region of conductive material comprising the steps of:
   providing a semiconducting substrate;
   forming a conductive layer overlying the semiconducting substrate;
   forming a photoresist material overlying the conductive layer;
   forming openings in the photoresist material which expose portions of the conductive layer and form a sidewall of the photoresist material;
   performing a pre-conditioning etch on the conductive layer to clean a surface of the conductive layer;
   exposing the photoresist layer to an ion bombardment environment to harden a sidewall surface of the photoresist material to form a hardened polymer veil layer adjacent the sidewall of the photoresist material; and
   removing the portions of the conductive layer which are exposed by the openings in the masking material to form said region of conductive material.

2. The process of claim 1 further comprising the step of:
   performing an over-etch step after the step of removing to further etch the conductive layer.

3. The process of claim 1 wherein the step of exposing comprises:
   exposing the photoresist material to a process gas which is 50%-80% by volume chlorine with a remainder of the process gas being an inert carrier gas.

4. The process of claim 3 wherein the step of exposing further comprises:
   simultaneously flowing substantially 30 to 50 sccm of chlorine and substantially 10 to 30 sccm of an inert gas into a process chamber which contains the photoresist material.

5. The process of claim 1 wherein the step of exposing comprises:
   exposing the photoresist material to a process gas which comprises chlorine (Cl) and an inert gas comprising an element selected from a group consisting of: helium, nitrogen, and argon.

6. The process of claim 1 wherein the step of exposing comprises:
   performing the exposing step in one of either a batch etch system or a single wafer etch system.

7. The process of claim 1 wherein the region of conductive material comprises a material selected from a group consisting of: polysilicon, silicon, amorphous polysilicon, germanium silicon, epitaxial formations, and doped silicon.

8. The process of claim 1 wherein the region of conductive material comprises a material selected from a group consisting of: a silicide material and a salicide material.

9. The process of claim 1 wherein the step of forming the photoresist material comprises:
   forming the photoresist material as photoresist material selected from the group consisting of: a positive photoresist and a negative photoresist.

10. The process of claim 1 wherein the step of performing the pre-conditioning etch comprises:
    etching the conductive layer to remove a native oxide from a surface of the conductive layer.

11. The process of claim 1 wherein the step of exposing comprises:
    forming the hardened polymer veil layer on only a sidewall of each of the openings in the photoresist material.

12. A process for forming a region of semiconductive material comprising the steps of:
    providing a silicon substrate;
    forming a semiconductive layer overlying the substrate, the semiconductive layer having a surface and having a native oxide formed on said surface;
    forming a photoresist mask layer overlying the semiconductive layer;
    forming openings in the photoresist mask layer which expose portions of the semiconductive layer, the openings forming sidewalls of the photoresist mask layer;
    etching the native oxide on the surface of the semiconductive layer which is exposed by the openings in the photoresist mask layer;
    forming a polymer coating on said sidewalls of the photoresist mask layer by exposing the photoresist mask layer to an ion bombardment environment, the polymer coating atomically consisting of repeating structural units; and
    etching the portions of the semiconductive layer which are exposed by the openings in the photoresist mask layer to form said region of semiconductive material.

13. The process of claim 12 further comprising the step of:
    performing an over-etch step after performing the step of etching the portions of the semiconductive layer wherein the over-etch step is used to further etch the semiconductive layer.

14. The process of claim 12 wherein the step of forming the polymer coating comprises:
    exposing the photoresist mask layer to a process gas which is substantially 50%-80% by volume chlorine with a remainder of the process gas being an inert carrier gas.

15. The process of claim 12 wherein the step of forming the polymer coating comprises:
    exposing the photoresist mask layer to a process gas which comprises chlorine (Cl) and an inert gas comprising an element selected from a group consisting: helium, nitrogen, and argon.

16. The process of claim 12 wherein the step of forming a semiconductive layer comprises:
    forming the semiconductive layer wherein a portion of the semiconductive layer comprises a material selected from a group consisting of: polysilicon, silicon, amorphous polysilicon, germanium silicon, epitaxial semiconductor formations, and doped silicon.

17. The process of claim 12 wherein the step of forming a semiconductive layer comprises:
    forming the semiconductive layer wherein a portion of the semiconductive layer comprises a material selected from a group consisting of: a silicide material and a salicide material.

18. A process for forming a region of polysilicon comprising the steps of:
    providing a silicon substrate;

forming a polysilicon layer overlying the silicon substrate, the polysilicon layer having a surface and having a native oxide formed on said surface;

forming a photoresist mask layer overlying the polysilicon layer;

forming openings in the photoresist mask layer which expose portions of the polysilicon layer, the openings forming sidewalls of the photoresist mask layer and defining at least one reflective notch in the photoresist mask layer;

etching the native oxide on the surface of the polysilicon layer which is exposed by the openings in the conductive layer;

forming a hardened polymer coating on said sidewalls of the photoresist mask layer by exposing the photoresist mask layer to an ion bombardment environment, wherein the hardened polymer coating is more resistant to removal than the photoresist mask layer;

etching the portions of the polysilicon layer which are exposed by the openings in the photoresist mask layer in an ambient having a first chemical composition; and over-etching portions of the polysilicon layer in an ambient having a second chemical composition to form said region of polysilicon and preventing the reflective notch from being transferred into the region of polysilicon due to the presence of the hardened polymer coating on the photoresist mask layer.

19. The process of claim 18 wherein the step of forming the hardened polymer coating comprises:

exposing the photoresist mask layer to a process gas which is substantially 50%-80% by volume chlorine with a remainder of the process gas being an inert carrier gas.

20. The process of claim 18 wherein the step of forming the hardened polymer coating comprises:

exposing the photoresist mask layer to a process gas which comprises chlorine ($Cl_2$) and an inert gas comprising an element selected from a group consisting of: helium, nitrogen, or argon.

21. A method for forming a semiconductor structure, the method comprising the steps of:

providing a substrate material;

forming a conductive layer overlying the substrate material;

forming a masking layer over the conductive layer;

patterning the masking layer to expose a portion of the conductive layer to form exposed potions of the conductive layer and form sidewalls of the masking layer;

exposing the masking layer to a gas-containing environment wherein atoms are ion bombarded onto the surface of the masking layer, the step of exposing forming a hardened sidewall layer by consuming a sidewall portion of the masking layer, the hardened sidewall layer being more resistant to removal than the masking layer when exposed to a removal chemistry; and removing the exposed portions of the conductive layer selective to the hardened sidewall layer.

22. A method for forming a semiconductor structure, the method comprising the steps of:

providing a substrate material;

forming a conductive layer overlying the substrate material;

forming a masking layer over the conductive layer;

patterning the masking layer to expose a portion of the conductive layer to form exposed potions of the conductive layer and form sidewalls and a top surface of the masking layer;

exposing the sidewalls of the masking layer to a gas-containing ion bombardment environment wherein the ion bombardment allows a hardened layer of material to be formed only adjacent the sidewalls of the masking layer by bombarding material off the top surface of the masking layer, the hardened layer of material consuming a sidewall portion of the masking layer; and etching the exposed portions of the conductive layer selective to the hardened layer of material.

* * * * *

UNITED STATES PATENT AND TRADEMARK OFFICE
CERTIFICATE OF CORRECTION

PATENT NO. : 5,332,653
DATED : July 26, 1994
INVENTOR(S) : Mark J. Cullen; Sean Hunkler It is certified that error appears in the above-indentified patent and that said Letters Patent is hereby corrected as shown below:

In claim 16, column 8, line 56
    change "of;" to --of:--

Signed and Sealed this

Twenty-second Day of November, 1994

Attest:

BRUCE LEHMAN

Attesting Officer

Commissioner of Patents and Trademarks